United States Patent [19]
Srinivasan et al.

[11] Patent Number: 5,706,224
[45] Date of Patent: Jan. 6, 1998

[54] CONTENT ADDRESSABLE MEMORY AND RANDOM ACCESS MEMORY PARTITION CIRCUIT

[75] Inventors: Varad Srinivasan, Los Altos Hills; Sanjay V. Gala; Ketan K. Mehta, both of Sunnyvale, all of Calif.

[73] Assignee: Quality Semiconductor, Inc., Santa Clara, Calif.

[21] Appl. No.: 729,626

[22] Filed: Oct. 10, 1996

[51] Int. Cl.$^6$ ................................................ G11C 15/00
[52] U.S. Cl. ................................................ 365/49; 395/435
[58] Field of Search ................................ 365/49; 395/435

[56]  References Cited

U.S. PATENT DOCUMENTS

| 4,890,260 | 12/1989 | Chuang et al. | 365/49 |
| 5,319,589 | 6/1994 | Yamagata et al. | 365/49 |
| 5,325,501 | 6/1994 | Carlstedt | 365/49 |
| 5,383,146 | 1/1995 | Threewitt | 365/49 |
| 5,502,832 | 3/1996 | Ali-Yahia et al. | 365/49 |

*Primary Examiner*—Tan T. Nguyen
*Attorney, Agent, or Firm*—Pennie & Edmonds LLP

[57]  ABSTRACT

A semiconductor memory device is disclosed which is partitionable into random access memory (RAM) and content addressable memory (CAM) subfields, and with which incremental comparisons may be efficiently conducted. The apparatus generally includes a memory array of N data storage locations of M bits each which may be divided into predefined segments, a means for comparing a search word with all data words stored in the array, a means for generating a match signal when the bits of the search word match the bits of the data words, and a configuration register and a plurality of transfer gates for selecting which of the predefined array segments are to function solely as random access memory. The apparatus may additionally include a plurality of storage means, each corresponding to a segment of the memory array, for storing the match signals generated from that corresponding segment during a comparison.

11 Claims, 2 Drawing Sheets

CONTENT ADDRESSABLE MEMORY AND RANDOM ACCESS MEMORY PARTITION CIRCUIT

BACKGROUND OF THE INVENTION

1. Technical Field

The present invention relates to semiconductor memory devices. In particular, the present invention relates to semiconductor memory devices which can be partitioned into random access memory (RAM) and content addressable memory (CAM) subfields.

2. Discussion of the Related Art

Content addressable memories are memory devices in which data is accessed and modified based upon the content of the stored data, rather than on the location in which that data is stored. Content addressable memories generally include multiple data storage locations comprised of multiple memory cells. Unlike random access memory, all data words stored in the storage locations of a content addressable memory may be simultaneously compared with a search word stored in a comparand register. Upon comparison with the search word at each storage location, a match signal is generated if a match occurs.

Semiconductor memory devices partitionable into content addressable memory and random access memory subfields are known in the art. For example, U.S. Pat. No. 5,383,146 to Threewitt ("'146 patent") describes a memory array in a single integrated circuit in which a portion of each data word may be characterized as content addressable memory (CAM), with the remaining portion of each data word functioning as random access memory (RAM).

In particular, the '146 patent describes a memory array formed by coupling a plurality of CAM cells in rows and columns. Each row of CAM cells makes up a data word consisting of a predefined number of data bits. Each CAM cell is comprised of a RAM cell which is attached to a comparator. The CAM array may be attached to an address decoder for locating particular data words, and may also be attached to a priority encoder for computing the address of the highest-priority row based upon previously established criteria.

According to the '146 patent, corresponding bits in all words (a column of bits) may be simultaneously compared to the applicable bit in a search word stored in a comparand register. Alternatively, the comparators for particular columns of bits may be selectively disabled, so that all bits in that column do not participate in a comparison with the search word in the comparand register. With their comparators disabled, these CAM cells then function as ordinary RAM cells.

As each bit stored in each CAM cell is compared with the corresponding bit in the search word, the comparator of that CAM cell generates either a match signal indicating a match between the search word bit and the data word bit, or a no-match signal indicating a failure to match. These signals are then carried by a match line to a priority encoder.

When the priority encoder identifies a data word which matches the search word, particular information related to the data word may be directly stored in or retrieved from the CAM cells which have been disabled so as to function as RAM cells. Thus, the structure described in the '146 patent locates a given data word by means of a comparison to a search word, and can provide access to the information in that data word without having to know or compute the address or location of the information. In addition, the memory array disclosed in the '146 patent may be partitioned into CAM and RAM subfields by disabling the comparators of the memory cells in selected individual columns of CAM cells to create RAM-functioning cells.

While the memory device of the '146 patent is useful for its intended purpose, there is a need for a memory array which can be partitioned into separate CAM and RAM subfields, and which consumes power more efficiently. In particular, there is a need for a memory array which can be partitioned into separate CAM and RAM subfields, and which can be used to perform incremental comparisons without executing, and without incurring the additional power necessary to execute, multiple comparisons.

Such a memory array would be particularly useful in local area network (LAN) environments for high-bandwidth, address-filtering applications, specifically in bridges, routers, and switches. It would also be ideal for other high-speed applications such as database accelerators, pattern recognition systems, and disk caches.

SUMMARY OF THE INVENTION

It is therefore an object of the present invention to provide a semiconductor memory device which is partitionable into CAM and RAM subfields, and with which incremental comparisons may be efficiently conducted.

In accordance with the present invention, there is provided a memory array which comprises a plurality of content addressable memory (CAM) cells coupled together to form a memory array of N data storage locations of M bits each. Each of the CAM cells comprises a random access memory (RAM) cell attached to a comparator. The memory array of the invention may be partitioned into a number of segments, some or all of which may be configured by the user to function as simple random access memory, rather than as content addressable memory. The memory array of the invention may also be located on a single integrated circuit. A comparand register for simultaneously comparing a search word with all data words stored in the memory array is additionally provided.

As each data bit stored in each individual CAM cell is compared with the corresponding bit in the search word, the comparator of each CAM cell will generate either a match signal indicating a match between the search word bit and the data word bit, or a no-match signal indicating a failure to match. The match or no-match signal is carried by a match line from each comparator to a priority encoder. The priority encoder will then select the highest-priority data word from all data words for which a match signal was generated by all bits of those data words.

In accordance with the invention, a configuration register for selecting which segments of the memory array are to function solely as random access memory cells is also provided. The configuration register is connected to a number of transfer gates, each of which corresponds to one of the segments of the memory array. These transfer gates receive and pass on the match signals from the content addressable memory cells in the corresponding segment if that segment is not selected through the configuration register to function solely as RAM, and receive and do not pass on the match signals of the content addressable memory cells which are in the corresponding segment if that particular segment is selected by said configuration register to function solely as RAM.

In accordance with another aspect of the invention, the memory device further includes a number of storage devices, each of which corresponds to one of the segments of the memory array. Each of these storage devices receives and stores the match signals of the content addressable memory cells located in the corresponding segment for use in conducting incremental searches wherein only one search need be performed.

BRIEF DESCRIPTION OF THE DRAWINGS

These and other features, aspects, and advantages of the present invention will become more readily apparent from the following detailed description, which should be read in conjunction with the accompanying drawings in which.

DETAILED DESCRIPTION OF THE INVENTION

Figure 1:
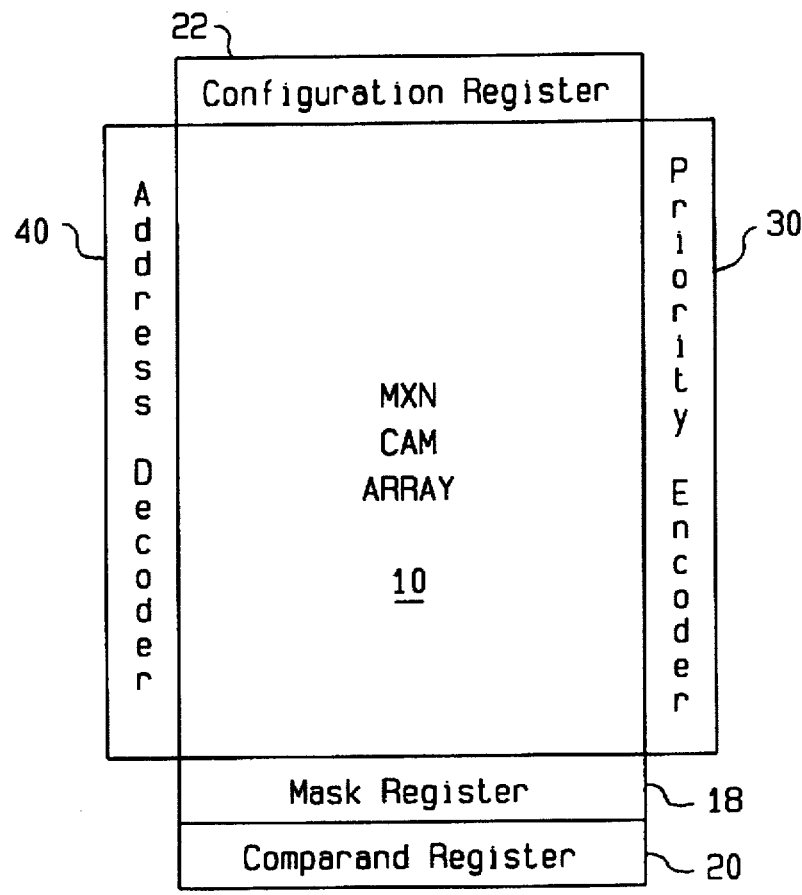
FIG. 1 is a block diagram of a memory array according to the present invention.

The following embodiments of the present invention will be described in the context of a memory device partitioned into content addressable memory and random access memory subfields, although those skilled in the art will recognize that the disclosed methods and structures are readily adaptable for broader application. Note that whenever the same reference numeral is repeated with respect to different figures, it refers to the corresponding structure in each such figure.

FIG. 1 discloses an exemplary embodiment of a selectively programmable memory array 10 according to the present invention. Memory array 10 is formed by coupling together a plurality of individual content addressable memory (CAM) cells in rows and columns. Each row of CAM cells includes a predefined number M of individual CAM cells, capable of storing a data word M bits in length. Each column of CAM cells includes a predefined number N of CAM cells, such that N data words may be stored in memory array 10.

Figure 3:
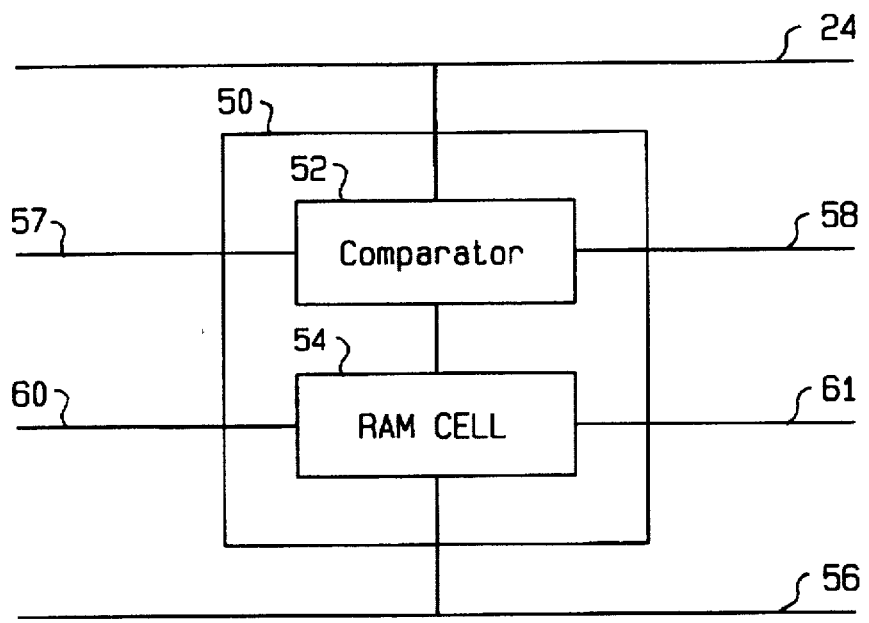
FIG. 3 is a schematic view of a single memory cell contained in the memory array of the present invention.
Figure 2:
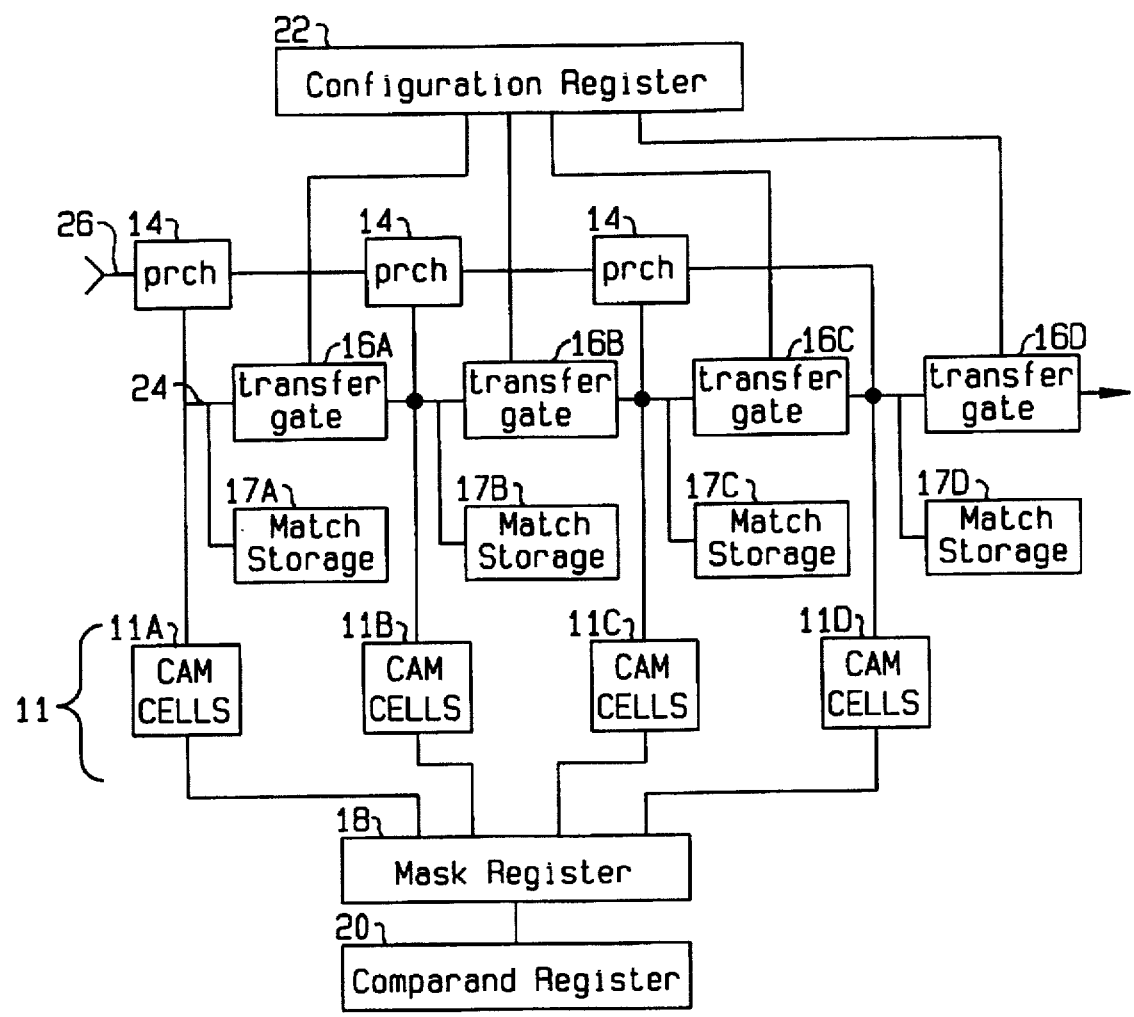
FIG. 2 is a schematic view of a segment of a memory array according to the present invention.

FIG. 2 discloses a detailed schematic of the memory array according to the present invention. However, for ease of understanding, FIG. 2 illustrates only a single row 11 of CAM cells from the multiple-row memory array 10 of the present invention. Moreover, although a row of CAM cells in the memory array may be made up of any number M of individual CAM cells, the present invention will be described in the context of a 64-bit row. In this illustrative context, CAM cell segments 11A–11D are comprised of 16 individual CAM cells (although a row of CAM cells may be divided up into any predefined number of CAM cell segments). As shown in FIG. 3, each individual CAM cell 50 in memory array 10 of the present invention is illustratively comprised of a RAM memory cell 54 attached to a comparator 52.

In accordance with the foregoing, a search word may be stored in comparand register 20 for comparison with each data word in memory array 10. Comparand register 20 is connected to each individual CAM cell 50 in each column of the memory array by comparison line 57 and an inverted comparison line 58, which may be used by comparand register 20 to enable and disable the comparison. As shown in FIG. 2, data from comparand register 20 may first be filtered through one or more user-configurable mask registers 18. Depending on how mask register 18 is configured, certain bits of the search word from comparand register 20 may be prevented from participation in the comparisons with the data words stored in memory array 10.

When a comparison is performed, unmasked bits in the search word are simultaneously compared to the bits in the corresponding columns of memory cells in memory array 10. Comparator 52 performs the comparison by comparing the contents of RAM cell 54 with the corresponding search word bit.

As each data bit stored in each individual CAM cell is compared with the corresponding bit in the search word, comparator 52 of each CAM cell 50 will generate either a match signal indicating a match between the search word bit and the data word bit, or a no-match signal indicating a failure to match. The match or no-match signal is carried by match line 24 from comparator 52 to priority encoder 30. If a no-match signal is generated for any of the one or more CAM cells in a particular CAM cell row, then priority encoder 30 is not activated by that particular row.

As shown in FIG. 2, match line 24 is connected to a pre-charge line 26 and a number of pre-charge devices 14. The combination of pre-charge line 26 and pre-charge devices 14 may be used to pull match line 24 high ($V_{cc}$), or more generally, to a match state. Match line 24 may then be pulled low, or more generally, to a no-match state, by CAM cells 50 if a match does not occur (pre-charge devices 14 are preferably weak devices so as to allow CAM cells 50 to pull match line 24 low).

Once priority encoder 30 identifies the highest-priority data word that matches the search word, memory access to the associated information from the RAM-functioning cells of that data word is provided. More particularly, once a match is established during a comparison cycle, priority encoder 30 generates the address of the highest-priority data word whose match line remained high during the comparison cycle. In one illustrative example, the highest priority matched data word is that word with the lowest physical address. The address of the highest-priority data word generated by priority encoder 30 may then be fed to address decoder 40, which decodes the address of the highest-priority data word so as to locate the data in the RAM functioning cells of the highest priority data word.

Once the address of the highest-priority data word is decoded, address decoder 40 uses bit line 60 and inverted bit line 61 to read from (or write to) the particular RAM cells 54 of the highest-priority data word, which may be individually selected using word line 56. Illustratively, if address decoder 40 provides the same signal to both bit line 60 and inverted bit line 61, then the contents of RAM cell 54 are read out. If address decoder provides different signals to bit line 60 and inverted bit line 61, then either a one or a zero is written to RAM cell 54, depending on whether bit line 60 is high and inverted bit line 61 is low, or vice versa. Address decoder 40 may also be used to assign an address to each data word that is loaded into memory array 10. In this manner, information may be retrieved from the RAM-functioning cells of the highest-priority data word whose match line remained high during the comparison cycle.

In accordance with the present invention, a configuration register 22 is also provided which allows the user to select various CAM cell segments 11A–11D to function as RAM cell segments in the memory array. As mentioned previously, this partitioning feature allows the creation of RAM storage space for associated data that can be stored alongside the CAM associative data on which searches or comparisons are performed. More particularly, this partitioning feature allows CAM cells storing data words and RAM-functioning cells storing associated information for the data words to be conveniently located on the same integrated circuit, thereby reducing the amount of time and energy that would be required to store associated information in RAM cells located on a separate integrated circuit.

As shown in FIG. 2, configuration register 22 is attached to a number of transfer gates 16A–16D which are located at various intervals (depending on the number of predefined CAM cell segments) on each match line 24 in memory array 10 (as mentioned, FIG. 2 discloses only a single row 11 and thus a single match line 24 from the entire multiple-row memory array 10 of the present invention). Thus, if a user determines that CAM cell segment 11A is to be used as RAM functioning cells and therefore a RAM cell segment, configuration register 22 may be used to open transfer gate 16A to ensure that any potential match signals originating from CAM cell segment 11A never reach priority encoder 30 from transfer gate 16D. Likewise, if a user determines that both CAM cell segment 11A and 11b are to be used as RAM cell segments, configuration register 22 may be used to open transfer gates 16A and 16B so that any potential match signals originating from CAM cell segments 11A and 11B never reach priority encoder 30. If a user determines that CAM cell segments 11A, 11B, and 11C are to be used as RAM cell segments, configuration register 22 may be used to open transfer gates 16A, 16B, and 16C so that any potential match signals originating from CAM cell segments 11A, 11B, and 11C never reach priority encoder 30. Finally, if a user determines that the entire memory array is to be used as RAM functioning cells, configuration register 22 may be used to disable transfer gates 16A, 16B, 16C, and 16D so that any potential match signals originating from anywhere in memory array 10 never reach priority encoder 30.

In this manner, the memory array of the present invention is configurable on, for example, 16-bit boundaries, with the segment partition occurring at one end of the 64-bit word. Moreover, unlike the prior art, the comparators of individual CAM cell columns, or even individual CAM cells 50, are not disabled so as to partition the memory circuit into CAM and RAM subfields. Instead, it is simply ensured that any match signals generated from these comparators never reach priority encoder 30.

This method of partitioning memory array 10 into CAM and RAM subfields is advantageous in that incremental searches which use only minimal power are facilitated. In particular, as the actual comparison of all CAM cell segments, including those functioning as RAM cell segments, with the search word is never disabled, the results of these comparisons may be stored in match storage devices 17A–17D for each cell segment, and in particular, those selected to act as RAM cell segments. Match storage devices 17A–17D may illustratively be comprised of a simple latch, although those skilled in the art will understand that any storage device may be used. The comparison results stored in match storage devices 17A–17D for each cell segment are then used after the initial comparison is performed to further narrow the search being conducted.

Thus, in an illustrative example, social security numbers may be incrementally searched for in memory array 10, with the memory array configured so as to store the social security numbers in one RAM cell segment, individuals' first names in a second RAM cell segment, and individuals' last names in a CAM cell segment. In this configuration, the whole name of the individual to be searched for may be placed in configuration register 22, and thus compared against all names in the memory array. As all last names are stored in CAM functioning segments (rather than RAM functioning segments), matches will occur wherever the last name in configuration register 22 matches the last name in the CAM cell segment.

Once this initial comparison is performed, a more narrow comparison may be performed on those individuals with matching last names by simply using the comparison results stored in match storage devices 17A–17D. More particularly, the match storage devices 17A–17D for those data storage locations in which the last names matched may be reviewed to determine which first names also matched. This comparison with respect to the first names may therefore be performed without conducting an additional memory array comparison and thus, unnecessarily consuming additional power. In this manner, incremental comparisons are advantageously performed with minimal power use.

Various embodiments of the invention have been described herein. The descriptions are intended to be illustrative, not limitative. Thus, it will be apparent to those skilled in the art that modifications may be made to the invention as described without departing from the scope of the claims set out below.

What is claimed is:

1. A memory device, comprising:
   a plurality of content addressable memory cells coupled together to form a memory array of N data storage locations of M bits each, said memory array divided into a plurality of predefined segments;
   a comparand register for storing a search word to be simultaneously compared to all data words stored in said array of N data storage locations;
   a comparator in each of said plurality of content addressable memory cells for generating a match signal, said match signal assuming a match state for each bit of each of said data words which is determined by said comparator to match said corresponding bit of said search word when said search word is compared with said data words, and said match signal assuming a no-match state for each bit of each of said data words which is determined by said comparator not to match said corresponding bit of said search word when said search word is compared with said data words;
   a configuration register for selecting which of said plurality of predefined segments of said memory array are to function solely as random access memory cells; and
   a plurality of gates, each of said plurality of gates corresponding to one of said plurality of predefined segments of said memory array, for receiving and selectively passing on said match signals of said content addressable memory cells in said corresponding predefined segment in accordance with signals from said configuration register.

2. The memory device according to claim 1, further comprising a plurality of storage means, each of said storage means corresponding to one of said plurality of predefined segments of said memory array, for receiving and storing said match signals of said content addressable memory cells in said corresponding predefined segment.

3. The memory device according to claim 1, wherein all content addressable memory cells, including those content addressable memory cells functioning solely as random access memory cells, are located on a single integrated circuit.

4. The memory device according to claim 1, further comprising a masking register connected to said comparand register for preventing from participation in said comparisons with said data words predefined bits of said search word.

5. The memory device according to claim 1, further comprising a priority encoder for receiving said generated match signals and for selecting the highest-priority data word from all data words for which a match signal indicating a match state was generated by all bits of said data words.

6. The memory device according to claim 5, further comprising:

a plurality of match lines, each corresponding to one of said N data storage locations, each connected to said plurality of content addressable memory cells storing a data word in said corresponding data storage location, and each connected to said priority encoder, said plurality of match lines capable of sending a match signal from said plurality of content addressable memory cells to said priority encoder; and wherein said plurality of gates are located at predefined positions on each of said plurality of match lines, such that each of said plurality of gates corresponds to one of said plurality of predefined segments of said memory array, and such that each of said plurality of gates receives and selectively passes on to said priority encoder said match signals of said content addressable memory cells in said corresponding segment in accordance with signals from said configuration register.

7. A method of programming a memory device containing a plurality of content addressable memory cells coupled together to form an array of N data storage locations of M bits each, each of said array divided into a plurality of predefined segments, and said content addressable memory cells comprising a random access memory (RAM) cell capable of storing one bit of information connected to a comparator, said method comprising the steps of:

simultaneously comparing a search word with all data words stored in said memory array of N data storage locations;

generating a match signal, said match signal assuming a match state for each bit of each of said data words which is determined to match said corresponding bit of said search word when said search word is compared with said data words, and said match signal assuming a no-match state for each bit of each of said data words which is determined not to match said corresponding bit of said search word when said search word is compared with said data words;

selecting at least one of said predefined segments of said memory array to function solely as random access memory cells;

receiving and passing on said match signals of said content addressable memory cells in said predefined segments which are not selected to function solely as random access memory cells; and receiving and not passing on said match signals of said content addressable memory cells in said predefined segments which are selected to function solely as random access memory cells.

8. The method according to claim 7, further comprising the step of:

separately receiving and storing said match signals of said content addressable memory cells for each of said predefined segments.

9. The method according to claim 8, wherein said step of receiving and storing further comprises the step of receiving and storing said match signals of said content addressable memory cells in each of said predefined segments in one of a plurality of storage means, each of said storage means corresponding to one of said predefined segments of said memory array.

10. The method according to claim 7, wherein said step of selecting comprises the step of selecting with a configuration register at least one of said predefined segments of said memory array to function solely as random access memory cells.

11. The method according to claim 7, wherein said step of receiving and passing on comprises the step of using a plurality of gates, each of said plurality of gates corresponding to one of said plurality of predefined segments of said memory array, to receive and pass on said match signals of said content addressable memory cells in said predefined segments if said segments are not selected to function solely as random access memory cells.

* * * * *